United States Patent
Wen et al.

(10) Patent No.: US 7,886,251 B2
(45) Date of Patent: Feb. 8, 2011

(54) SYSTEM AND METHOD FOR BUILDING CONFIGURABLE DESIGNS WITH HARDWARE DESCRIPTION AND VERIFICATION LANGUAGES

(75) Inventors: William J. Wen, Austin, TX (US); Ashwin Matta, Round Rock, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 194 days.

(21) Appl. No.: 11/752,141

(22) Filed: May 22, 2007

(65) Prior Publication Data

US 2008/0295056 A1    Nov. 27, 2008

(51) Int. Cl.
*G06F 17/50* (2006.01)
*H03K 19/00* (2006.01)
(52) U.S. Cl. .................... 716/17; 716/1; 716/4; 716/18; 717/114; 717/140
(58) Field of Classification Search .............. 716/1, 716/17, 4, 18; 717/114, 140
See application file for complete search history.

(56) References Cited

U.S. PATENT DOCUMENTS

| 2005/0039148 A1* | 2/2005 | Masuda et al. ............. 716/1 |
| 2005/0050509 A1* | 3/2005 | Fields et al. ............... 716/18 |
| 2005/0080610 A1* | 4/2005 | Toma et al. ................ 703/22 |
| 2005/0149898 A1* | 7/2005 | Hakewill et al. ........... 716/18 |

* cited by examiner

*Primary Examiner*—Paul Dinh
*Assistant Examiner*—Nha T Nguyen
(74) *Attorney, Agent, or Firm*—Patent Venture Group PLC; Joe A. Brock, II; Raymond E. Roberts (57) ABSTRACT

An invention is provided for building configurable designs synthesizable to gates. The invention includes creating a configurable design using an HDL. The configurable design has a plurality of instantiated configurable constructs that can be optionally included in a design. Basically, the configurable design is an all-inclusive design having a large set of features, including varying interfaces, FIFO depths, and other features. Then, a derived design is generated by removing configurable constructs from the configurable design based on a specification, typically a customer specification received from a customer for a particular design. The specification indicates which configurable constructs are to be included in a derived design. Thereafter, the derived design is synthesizable in logic.

16 Claims, 10 Drawing Sheets

SYSTEM AND METHOD FOR BUILDING CONFIGURABLE DESIGNS WITH HARDWARE DESCRIPTION AND VERIFICATION LANGUAGES

BACKGROUND OF THE INVENTION

1. Field of the Invention

This invention relates generally to hardware design, and more particularly to building configurable designs synthesizable to gates with hardware description and verification languages.

2. Description of the Related Art

In the design of hardware logic, testing and verification through simulation is essential. As such, logic designs typically are specified utilizing a hardware descriptive language (HDL), such as Verilog or SystemVerilog, which are standard IEEE hardware descriptive languages. Verilog and SystemVerilog provide textual formats for describing hardware circuits and systems, which can be used for verification through simulation, timing analysis, test analysis (testability analysis and fault grading), and logic synthesis. These HDLs can be utilized to describe, verify, and simulate the operation of the hardware design.

Figure 1:
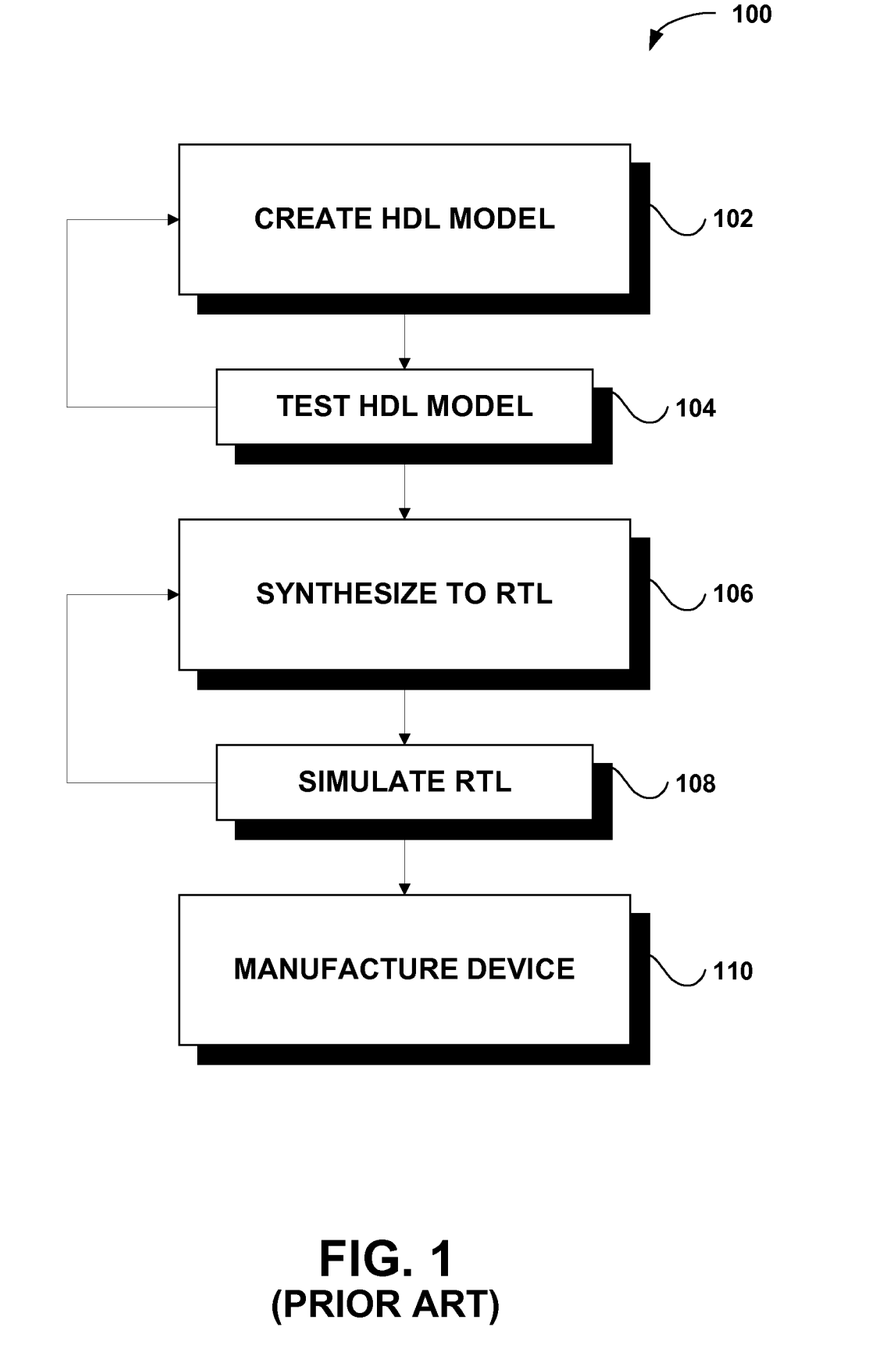
FIG. 1 is a flowchart showing an exemplary prior art process for manufacturing hardware logic designs.

FIG. 1 shows an exemplary prior art process 100 for manufacturing hardware logic designs. Following the prior art methodology 100, an HDL model of the hardware logic device is created using an HDL language, such Verilog or SystemVerilog HDL, in operation 102. Generally, the HDL model is used to describe what the design does. Once fully described and modeled using the HDL language, the HDL model is run though a series of simulation tests, in operation 104. The test cases are written utilizing the same HDL utilized to model the hardware logic device. The design can then be altered and optimized based on the simulation results.

Once the HDL model is optimized and has passed the test cases of operation 104, the HDL model is synthesized to a register transfer level (RTL) model, in operation 106. RTL defines a logic circuit's behavior in terms of the flow of signals or transfer of data between registers, and the logical operations performed on those signals. The RTL model describes how the design does the functions described in the HDL model. The RTL can later be converted to a gate-level description of the circuit using a logic synthesis tool.

Once synthesized to an RTL model, the RTL model is run though a series of simulation tests, in operation 108. As above, test cases are written utilizing the same language utilized to model the hardware logic device. The design can then be verified based on the simulation results.

After all testing, the device is manufactured in operation 110. As mentioned above, the RTL is synthesized to a gate-level description of the circuit using a logic synthesis tool. Thereafter, placement and routing tools utilize the gate-level description to create a physical layout for the device, which is used in the manufacturing of the device.

Generally, application specific integrated circuit (ASIC) developers need to tape-out their designs in six to eight months to remain competitive in the marketplace. However, as ASIC designs become more complicated, ASIC developers are becoming unable to reach this goal because redesigning all the components of increasingly complex chips takes longer and longer. To remedy this, ASIC developers have turn to third party "ready-made" designs for many of the individual subsystems of the ASICs.

For example, in designing memory subsystems an ASIC developer may purchase ready-made memory controller designs from a third party subsystem developer. The purchased memory controller design can then be integrated into the overall ASIC design. Thus, from the subsystem developer point of view, being able to accommodate a plurality of customer requests is beneficial. However, customer requests often vary from one ASIC developer to the next. As a result, subsystem developers often are required to redesign their subsystems to fit the specific requests of each customer. Accompanying the effort of the redesign, the subsystem developers also need to re-verify the design. In general, the verification effort incurs generating additional test stimulus and changes to the testing infrastructure.

One conventional approach to addressing this issue has been to design programmable general purpose subsystems. A programmable general purpose subsystem, such as a programmable general purpose memory controller, allows the customer to program the individual features of the subsystem to fit into the overall ASIC design. Unfortunately, all the features of a programmable general purpose subsystem generally are not all utilized in any specific design. As a result, unused features will be present on the overall chip, using valuable resources and space that could be better utilized for more useful elements.

Moreover, programmable general purpose subsystems still have clearly defined interfaces that cannot be altered. As a result, the customer is required to design their systems to conform to these interfaces. This conformity can often increase the customer's design costs or make the programmable subsystem unusable to the customer who cannot alter their predefined interfaces.

In view of the foregoing, there is a need for systems and methods for building configurable designs synthesizable to gates. The methods should provide highly configurable designs that allow for interface configurability and do not require the customer to program the device for particular uses. Moreover, the methods should allow the design to be configured to a specific use, and not include extraneous features not requested by the customer.

SUMMARY OF THE INVENTION

Broadly speaking, the present invention fills these needs by providing systems and methods for building highly configurable designs with hardware description and verification languages. In one embodiment, a method for building configurable designs is disclosed. The method includes creating a configurable design using an HDL. The configurable design has a plurality of instantiated configurable constructs that can be optionally included in a design. Basically, the configurable design is an all-inclusive design having a large set of features, including varying interfaces, FIFO depths, and other features. Then, a derived design is generated by removing configurable constructs from the configurable design based on a specification. The specification typically is a customer specification received from a customer for a particular design. The specification indicates which configurable constructs are to be included in a derived design. That is, the specification indicates which features are included in a derived design, and how these features are configured. The derived design is then suitable for synthesis. The configurable constructs generally include specific features that may optionally be included in the derived design, such as error correction code functionality. The configurable constructs can also include sizing-based configurability constructs that allow varying bus sizes and varying FIFO sizes in the derived design. Further configurable constructs can include connection-based configurability constructs that provide connection configurability based on features included in the derived design and attribute-based configurability constructs that provide configurability based attribute strings inserted into source code of the configurable design.

In a further embodiment, a system for building configurable designs is disclosed. The system includes a configurable design modeled in an HDL. As above, the configurable design includes a plurality of instantiated configurable constructs that can be optionally included in a design. A configuration module is also included that removes configurable constructs from the configurable design based on a specification, which indicates particular configurable constructs that are to be included in a derived design. The derived design is then suitable for synthesis. In one embodiment, the configuration module utilizes a configuration array to generate the derived design. Here, the configuration array is configured based on the specification to indicate which configurable constructs are to be included in the derived design. The configuration module can further utilize a feature array to generate the derived design. The feature array includes derivative values based on selected values in the configuration array.

A method for building a memory controller is disclosed in an additional embodiment of the present invention. The method includes creating a configurable controller model using an HDL. Similar to above, the configurable controller model includes a plurality of instantiated configurable constructs that can be optionally included in a derived controller model. These configurable constructs include specific features, such as ECC functionality, that may optionally be included in the derived controller model. The method further includes generating a derived controller model by removing configurable constructs from the configurable controller model based on a customer specification. The derived controller is then suitable for synthesis.

Embodiments of the present invention advantageously provide systems and methods for creating reusable configurable designs that can be configured to fit specific design requests. The resulting derived delivery RTL designs advantageously include only what was requested, and can then be delivered to the customer for inclusion in their larger design. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for building configurable designs synthesizable to gates with hardware description and verification languages. In general, embodiments of the present invention provide highly configurable designs by first building and testing an all-inclusive configurable controller having a large set of features, including varying interfaces, FIFO depths, and other features. Then, upon receiving a customer request, a derived controller is created by stripping out non-requested features from the configurable controller and configuring the configurable controller interfaces and other parameters to conform to the customer request. The resulting derived RTL design includes only what was requested, and can then be delivered to the customer for inclusion in their larger design.

In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 2:
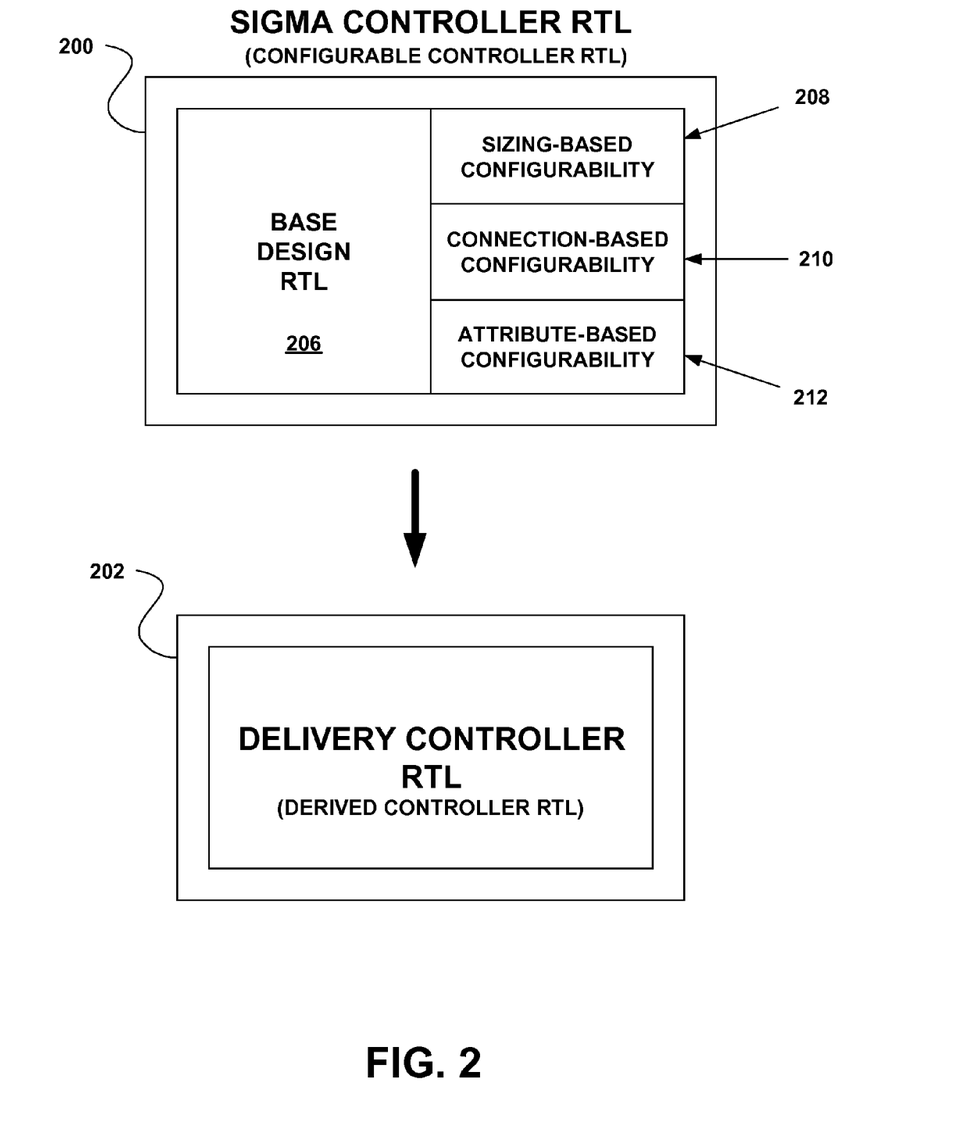
FIG. 2 is a diagram showing an exemplary Sigma controller and resulting delivery controller, in accordance with an embodiment of the present invention.

FIG. 1 was described in terms of the prior art. FIG. 2 is a diagram showing an exemplary configurable Sigma controller RTL 200 and resulting derived delivery controller RTL 202, in accordance with an embodiment of the present invention. The Sigma controller RTL 200 is a configurable controller and includes base design RTL 206 and a plurality of configurable constructs 208-212 for configurability. As mentioned above, the Sigma controller RTL 200 is an all-inclusive controller having a large set of features, including varying interfaces and varying FIFO depths, which can be provided to a customer. The Sigma controller RTL can be envisioned as a sum of all controllers that can be configured from a base design. That is, the Sigma controller RTL 200 is an environment wherein all sections and modules of RTL code for the configurable controller are instantiated.

As illustrated in FIG. 2, configurability can be categorized as sizing-based configurability 208, connection-based configurability 210, and attribute-based configurability 212. Most HDLs require that sizing parameters, such as bus width, and queue depth, to be constant by the start of simulation time. However, as will be described in greater detail below, the sizing-based configurability 208 of the embodiments of the present invention includes configurable constructs such as FIFO depths that can be re-sized at simulation time without re-elaboration, yet can also be sized based on a specific customer request. Similarly, the connection-based configurability 210 of the embodiments of the present invention allows changes to connections, such as bus, control and status connections, at simulation time without requiring re-elaboration. Finally, attribute-based configurability 212 allows the designer to correlate specific constructs with specific features.

To test different sizing parameters in a design, conventionally developers were forced to create these constant parameters prior to simulation. Each combination of different sizing parameters also forced a re-compile or re-elaboration by the simulator. Because the sizing-based configurability 208 of the embodiments of the present invention includes configurable constructs such as FIFO depths that can be sized based a customer request, embodiments of the present invention allow changing of sizing parameters at the start of simulation without requiring re-elaboration.

Similarly, designers conventionally used the pre-processor directive "ifdef" to conditionally connect buses or wires based on the needs of a project. This resulted in a specific set of defines that didn't change throughout the project. However, the directive "ifdef" generally is inadequate in describing complex combinations of features. Advantageously, the connection-based configurability 210 of the embodiments of the present invention allows changes to connections, such as bus, control and status connections, at simulation time without requiring re-elaboration.

In operation, embodiments of the present invention configure the configurable constructs 208-212 of the Sigma controller RTL 200 based on a customer request. The resulting RTL is delivered to the customer as the delivery controller RTL 202. Hence, the delivery controller RTL 202 is a derived controller and includes only the features, configured interfaces, number and size of ports, depths of FIFOs as requested by the customer.

Figure 3:
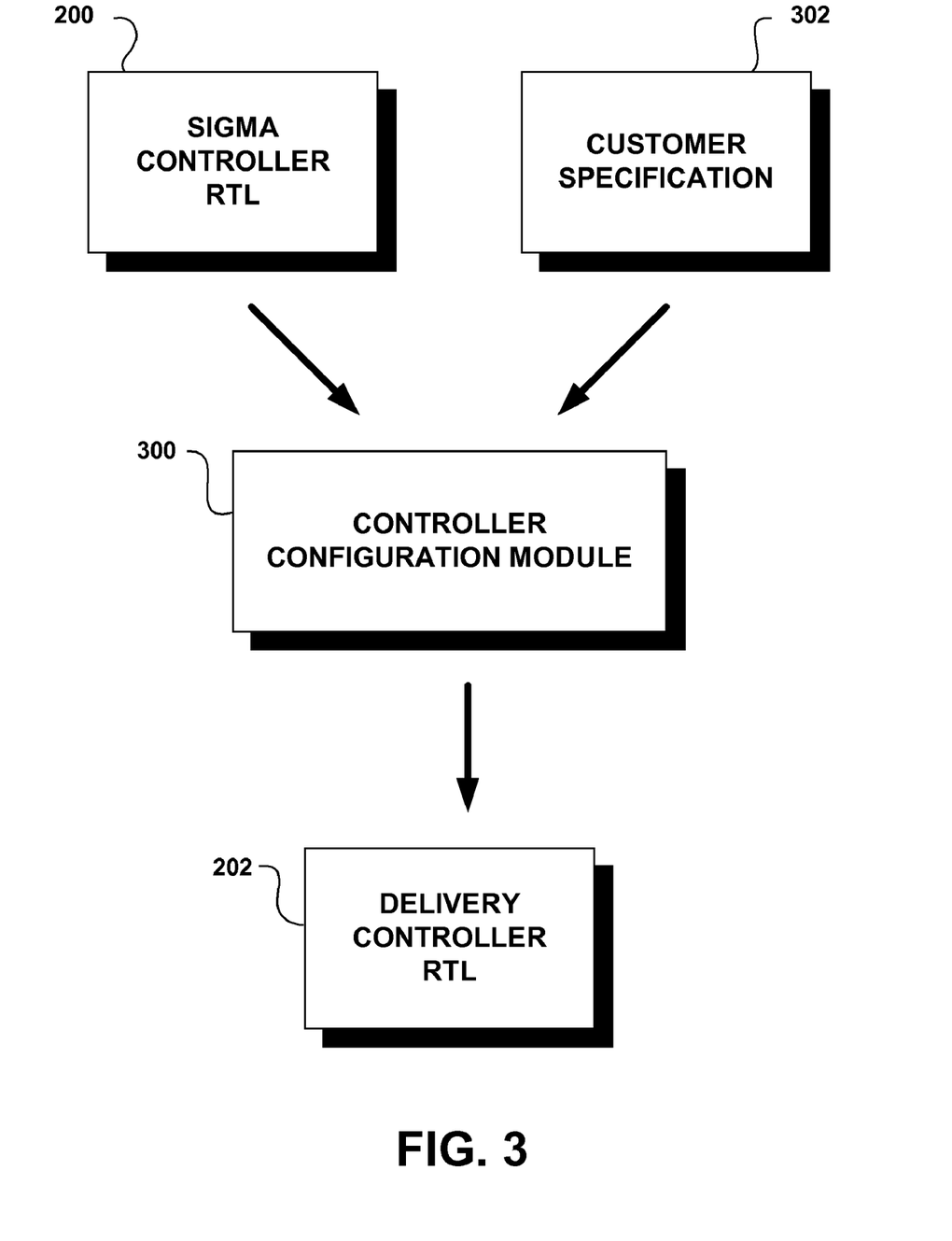
FIG. 3 is a diagram showing logical modules for building configurable designs, in accordance with an embodiment of the present invention.

FIG. 3 is a diagram showing logical modules for building configurable designs, in accordance with an embodiment of the present invention. Embodiments of the present invention configure the Sigma controller RTL 200 by providing it to a controller configuration module 300, along with a customer specification 302. As discussed above, the Sigma controller RTL 200 includes base design RTL and a plurality of configurable constructs, which are categorized as sizing-based configurability, connection-based configurability, and attribute-based configurability. The customer specification 302 specifies the features, interface configuration, number and size of ports, FIFO depths, and other attributes to be included in the delivery controller RTL 202. It should be noted that the Sigma controller RTL 200, controller configuration module 300, and customer specification 302 are not necessarily separate entities, but can be considered broad concepts to further understanding of the embodiments of the present invention.

In operation, the controller configuration module 300 configures the Sigma controller RTL 200 based on the customer specification 302. More specifically, the controller configuration module 300 strips out non-requested features, and configures interfaces and other parameters to conform to the customer request. The result is the delivery controller RTL 202, specifically customized to the requirements of a customer. Thereafter, the delivery controller RTL 202 can be delivered to the customer for inclusion in their larger design. To aid in controller configuration, the controller configuration module 300 includes a plurality of packages for configuration purposes, as illustrated next with reference to FIG. 4.

Figure 4:
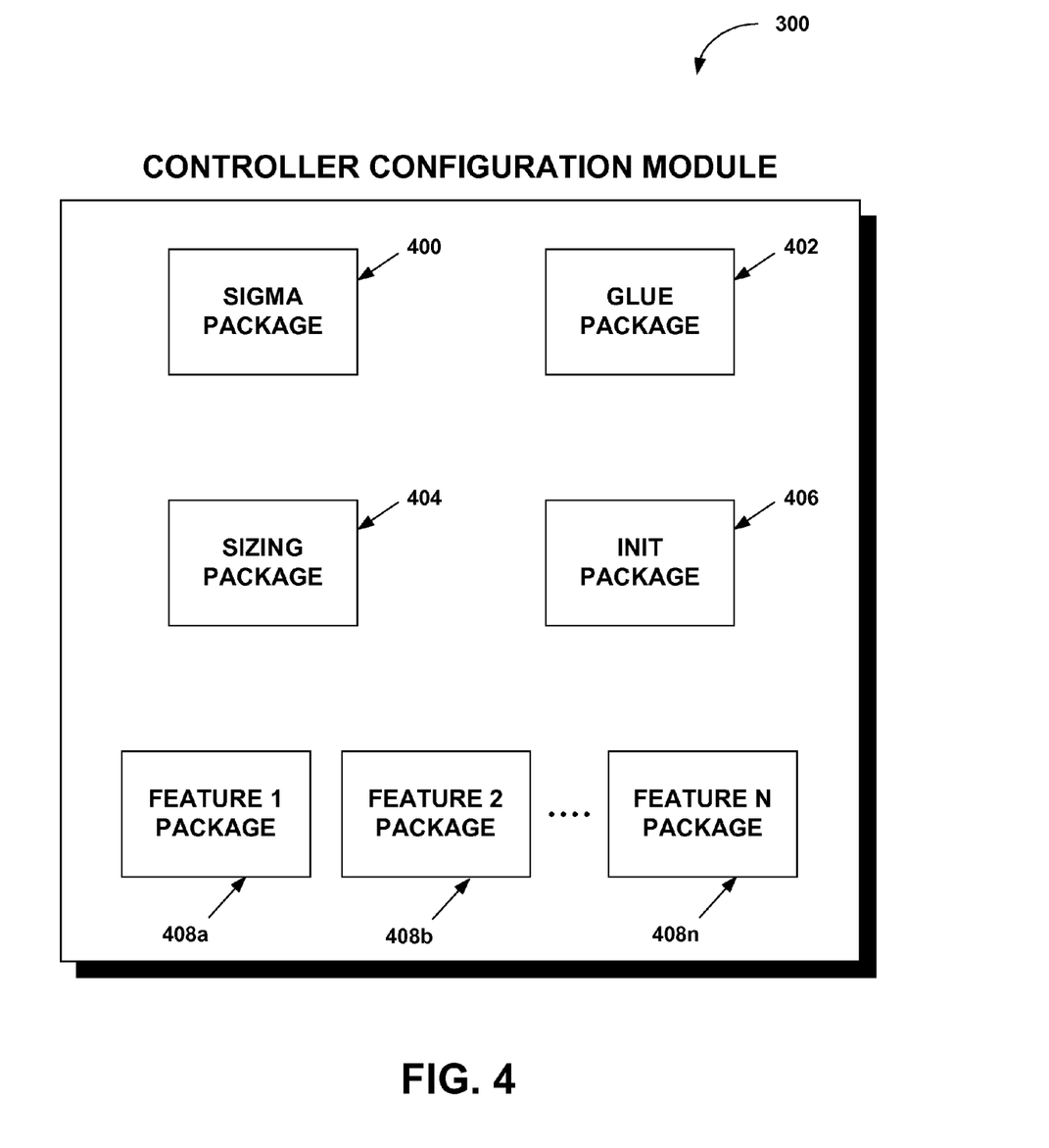
FIG. 4 is a diagram showing an exemplary controller configuration module, in accordance with an embodiment of the present invention.

FIG. 4 is a diagram showing an exemplary controller configuration module 300, in accordance with an embodiment of the present invention. The controller configuration module 300 includes a plurality of packages to assist in configuring the Sigma controller into delivery controller RTL. In particular, the controller configuration module 300 includes a sigma package 400, a glue package 402, a sizing package 404, an initialization package 406, and a plurality of feature packages 408a-408n. Each package is essentially a bundle of variables, parameters, arrays, and functions under different namespaces. Embodiments of the present invention utilize the different namespaces to distinguish among feature-specific functions and variables.

The sigma package 400, together with the sizing package 404, provides variable sizing of FIFO depths and bus sizing. In one embodiment, the variable-names defined in the sigma package 400 are SystemVerilog parameters, and thus are constant at the start of the simulation. By contrast, the variable-names in the sizing package 404 are SystemVerilog integers, and thus can change during simulation, as will be described in greater detail subsequently.

The glue package 402 includes two associative arrays used for defining particular configurations of the Sigma controller RTL 200. Although, embodiments of the present invention are described in terms of associative arrays for configuration, it should be noted that any type of array indexing can be utilized, including integer based array indexing. In one embodiment, the associative arrays use enumerated values or string values for indexing, as illustrated in FIG. 5.

Figure 5:
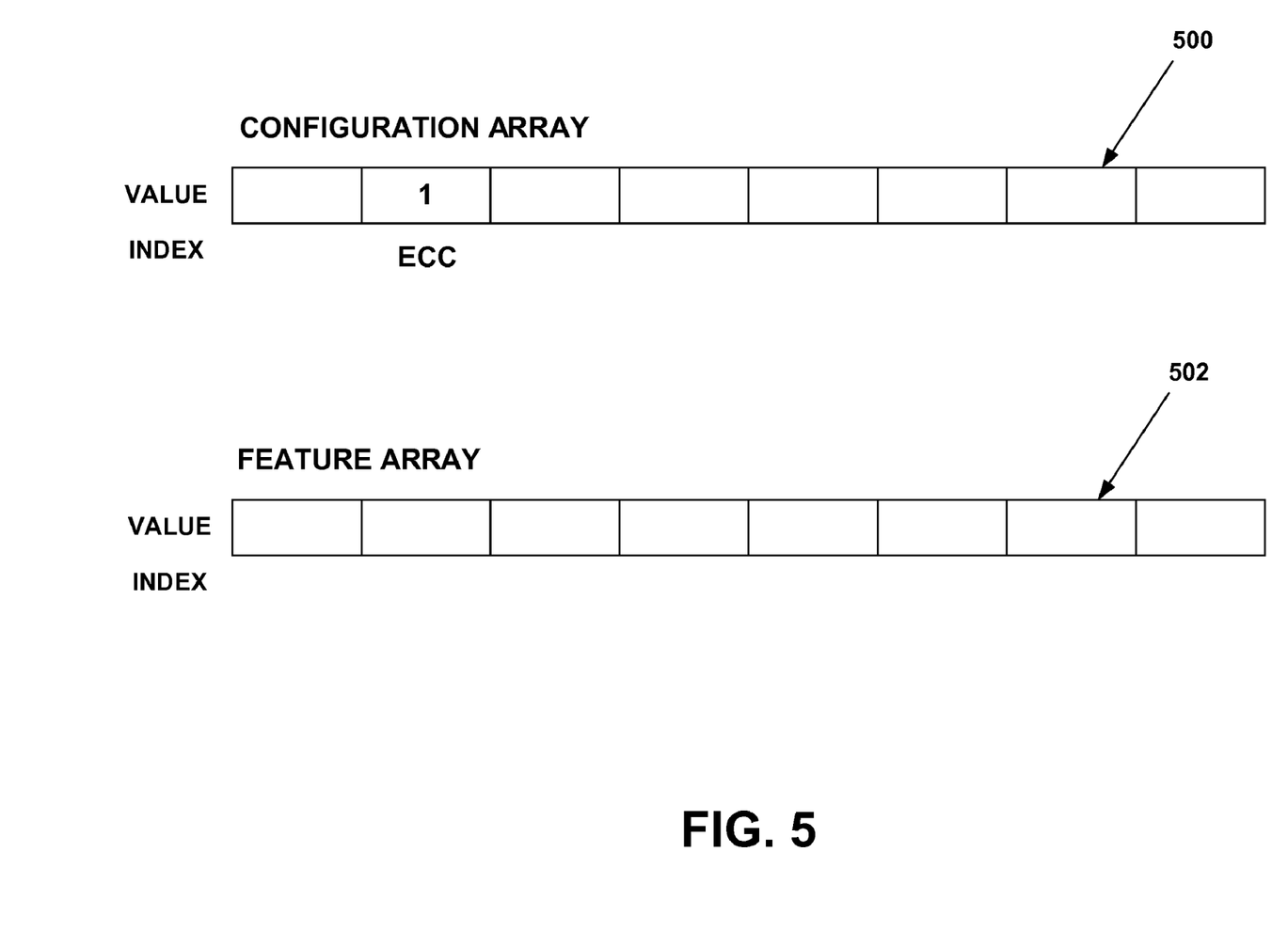
FIG. 5 is a diagram showing associative arrays of the glue package, in accordance with an embodiment of the present invention.

FIG. 5 is a diagram showing associative arrays of the glue package, in accordance with an embodiment of the present invention. The associative arrays include a configuration array 500 and a feature array 502. In normal operation, the configuration array 500 is utilized to store configuration data from the customer request. In one embodiment, the configuration array 500 includes integer values that indicate whether a particular feature is to be included in the delivery controller RTL. For example, if an "ECC" feature is available on the Sigma controller and is included in the customer specification, the array value at the "ECC" index can be a nonzero value. On the other hand, if an "ECC" feature is not included in the customer specification, the array value at the "ECC" position would be a zero. An exemplary HDL code section can then check the value at the desired feature position in the configuration array to determine if the feature should be included in the delivery controller. For example, the code section:

if(glue::cfg["ECC"]), could be utilized to determine if the ECC feature should be included in the delivery controller. However, when testing the Sigma controller 200 in its entirety the configuration array 500 is filled in using an initialization function, as will be discussed subsequently. The feature array 502 is utilized to store derivative values, based on selected values.

Referring back to FIG. 4, the initialization package 406 aggregates specific functionalities from all known packages. In one embodiment, the initialization package 406 consolidates two functionalities: sigma initialization functions and validation functions. The sigma initialization functions are utilized to fill in the configuration array 500 when testing the Sigma controller RTL 200. The validation functions are utilized to check for invalid combinations when values are changed during design and testing.

The feature packages 408a-408n define specific features that are available for inclusion in the delivery controller RTL. Features, defined using feature packages, allow embodiments of the present invention to randomize the configuration of the controller before running stimulus through the design. They are also the means by which the configuration module decides which sections of code and/or instantiations to remove.

As will be described in greater detail subsequently, features are named using strings, such as "ECC" or "SPLIT," which are used as indices into an associative array. The code to support a feature is written in a feature-specific package. For example, error correcting code (ECC) support can be defined in its own feature package for use in the memory controller.

In one embodiment, each package can include a "kosher( )" function, which includes the known restrictions with combinations of features and/or sub-features. The restrictions can be coded directly inside the kosher( ) function, or the kosher( ) function can call other functions. In this manner, the package-specific kosher( ) function informs the simulation if specific combinations of features are acceptable. In one embodiment, a kosher( ) function provides a zero return-code if it finds something wrong with a configuration, or a non-zero return-code if the kosher( ) function finds nothing wrong with a configuration.

The kosher( ) function also adds or removes elements in the feature associative array based on the customer specification or on the Sigma configuration. In one embodiment, a kosher( ) function is included in the init package that calls the kosher( ) function in all known packages. Once all features are defined and the Sigma controller tested, delivery controller RTL can be generated based on a particular customer specification, as discussed next with reference to FIG. 6.

Figure 6:
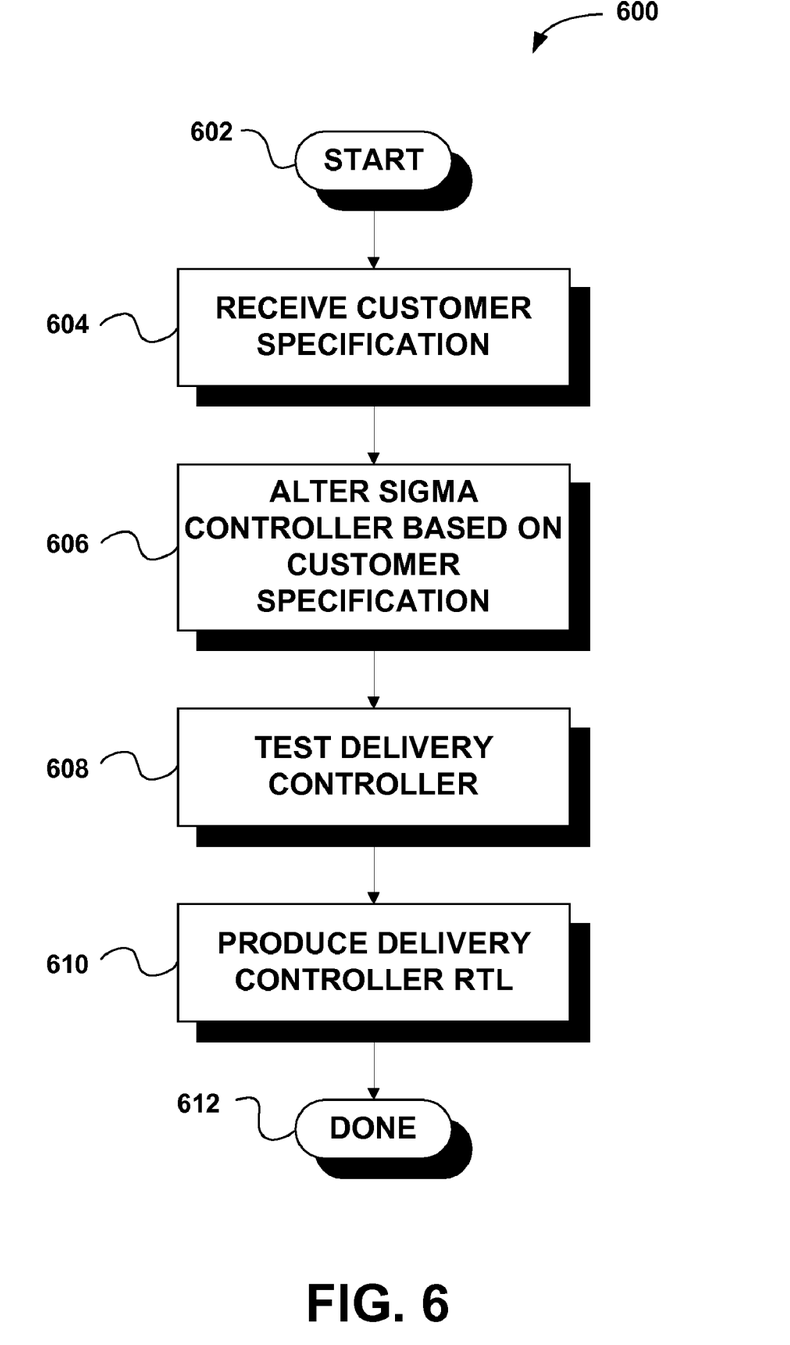
FIG. 6 is a flowchart showing a method for building configurable designs with HDL, in accordance with an embodiment of the present invention.

FIG. 6 is a flowchart showing a method 600 for building configurable designs synthesizable to gates with HDL, in accordance with an embodiment of the present invention. In an initial operation 602, preprocess operations are performed. Preprocess operations can include, for example, generating a Sigma controller including base design RTL and a plurality of configurable constructs for configurability, testing the Sigma controller RTL, and other preprocess operations that will be apparent to those skilled in the art after a careful reading of the present disclosure.

In operation 604, a customer specification is received. As mentioned above, ASIC developers often purchase ready-made memory controller designs from third party subsystem developers. Generally, the memory controller must be customized to fit the specific requests of each customer. Thus, the customer specification defines the specific configuration of the requested delivery controller, including bus sizing, FIFO depth, port sizing, and specific features that are to be included in the controller.

In operation 606, the Sigma controller RTL is configured based on the customer specification. As mentioned above, the Sigma controller RTL is an all-inclusive controller having a large set of features, including varying interfaces and varying FIFO depths, which can be provided to a customer. Thus, the Sigma controller RTL is an environment wherein all sections and modules of RTL code for the configurable controller are instantiated. In one embodiment, the controller configuration module strips out non-requested features, and configures interfaces and other parameters to conform to the customer request. The result is the delivery controller RTL, which includes only the features, configured interfaces, number and size of ports, and depths of FIFOs as requested by the customer.

Figure 7:
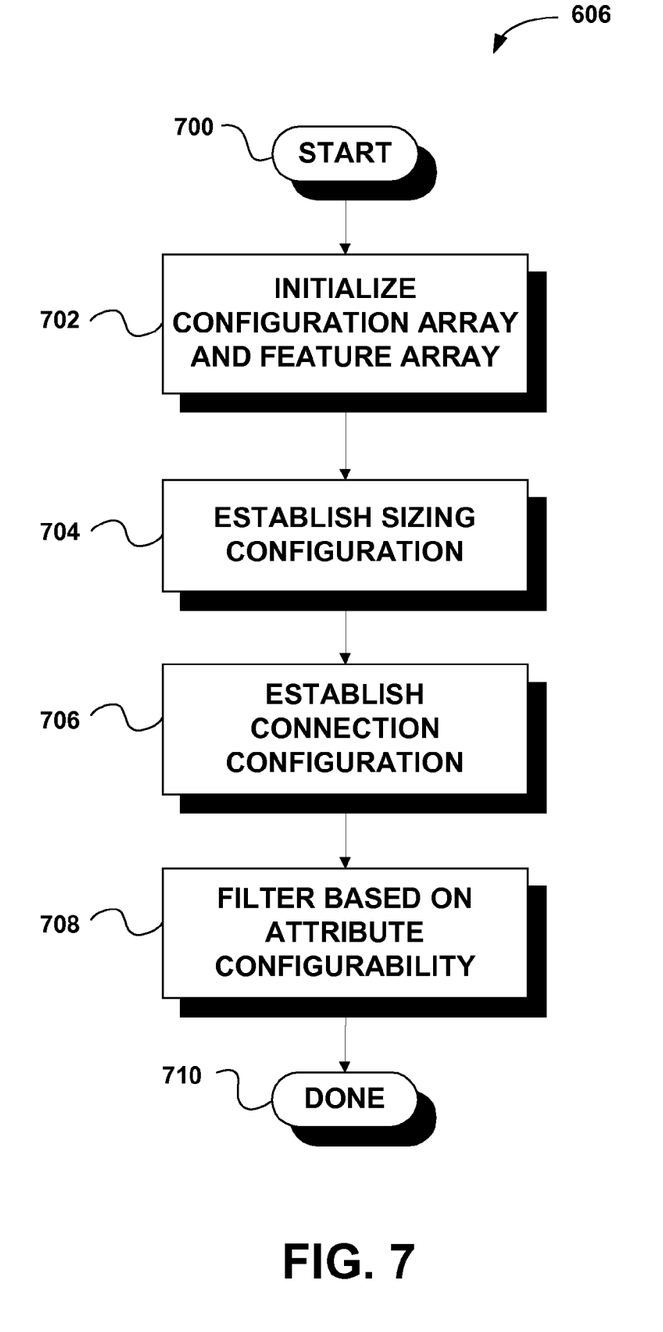
FIG. 7 is a flowchart showing a method for configuring designs based on a Sigma controller and a customer specification, in accordance with an embodiment of the present invention.

FIG. 7 is a flowchart showing a method 606 for configuring designs based on a Sigma controller and a customer specification, in accordance with an embodiment of the present invention. In an initial operation 700, preprocess operations are performed. Preprocess operations can include, for example, creating a Sigma controller, receiving a customer specification, and other preprocess operations that will be apparent to those skilled in the art after a careful reading of the present disclosure.

In operation 702, the configuration array and feature array of the glue package are initialized. As mentioned previously, in one embodiment the configuration array and the feature array are associative arrays that use strings or enumerated values for array indexing. The configuration array is utilized to store configuration data from the customer request. In one embodiment, the configuration array includes integer values that indicate whether a particular feature is to be included in the delivery controller RTL. For example, if an "ECC" feature is available on the Sigma controller and is included in the customer specification, the array value at the "ECC" index can be a nonzero value. On the other hand, if an "ECC" feature is not included in the customer specification, the array value at the "ECC" position would be a zero. The feature array is utilized in a similar manner to the configuration array to store derivative values, based on selected values in the configuration array.

Sizing based configuration is established in operation 704. When using SystemVerilog, designers are required to use constant sizing parameters for bit-vectors and memories. As discussed above, the variable-names defined in the sigma package are SystemVerilog parameters, and thus are constant at the start of the simulation. Thus, embodiments of the present invention use variable-names from the sigma package for declaring sizes for widths of buses and for depths of memory arrays, such as the memory used for a FIFO.

The variable-names in the sizing package are SystemVerilog integers, and thus can change during simulation. Thus, to dynamically size vectored variables during simulation, embodiments of the present invention use the variable-names from the sizing package when accessing the wires or registers (for example, when using an "assign" statement or inside an "always" block). This applies both to reading from wires or registers, and to writing to registers.

This approach allows the SystemVerilog simulator to work, and also allows resizing of parameters during simulation. The variable-names defined in the sigma package are SystemVerilog parameters, and thus are constant at the start of the simulation. In contrast, the variable-names in the Sizing package are SystemVerilog integers, and thus can be changed during simulation.

Figure 8A:
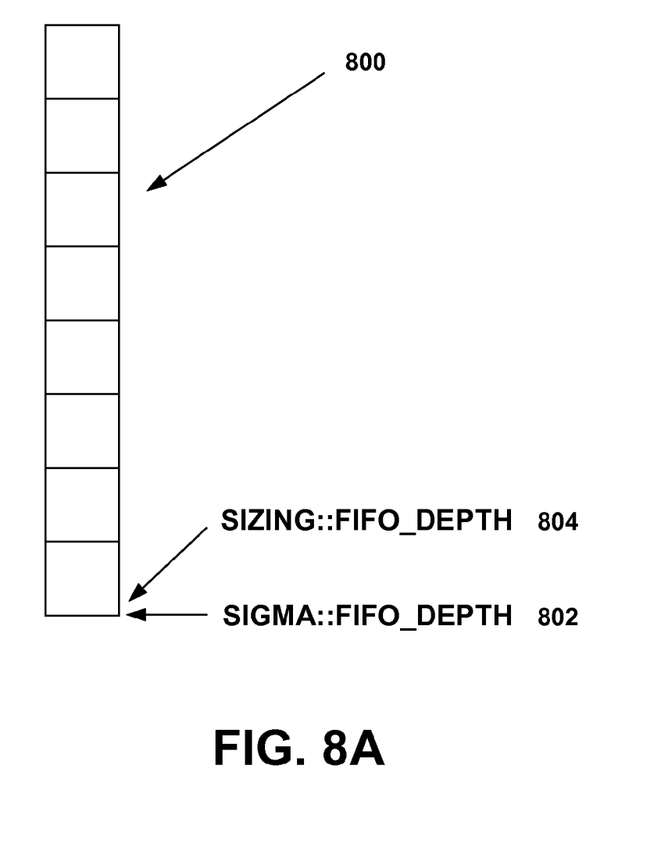
FIG. 8A is an illustration showing a FIFO declared using the parameter sigma::FIFO_DEPTH from the sigma package, in accordance with an embodiment of the present invention.
Figure 8B:
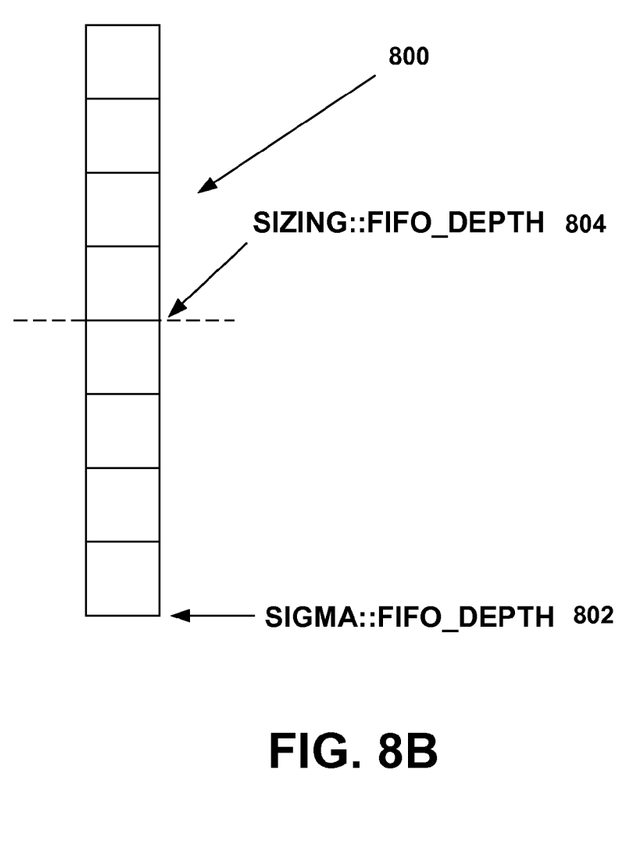
FIG. 8B is an illustration showing the FIFO having the FIFO depth changed utilizing the integer sizing::FIFO_DEPTH, in accordance with an embodiment of the present invention.

For example, the sigma package can declare a type parameter FIFO_DEPTH. As a SystemVerilog parameter, sigma::FIFO_DEPTH cannot be changed during simulation. The sizing package can declare a type integer FIFO_DEPTH. As a SystemVerilog integer, sizing::FIFO_DEPTH can be changed during simulation. These values can then be utilized to create a FIFO that can change during simulation, as illustrated in FIGS. 8A and 8B. By accessing the sizing::FIFO_DEPTH integer, the RTL design also dynamically adjusts to the re-configuration for such state-information as "FIFO Full" or "FIFO Empty."

FIG. 8A is an illustration showing a FIFO 800 declared using the parameter sigma::FIFO_DEPTH 802 from the sigma package, in accordance with an embodiment of the present invention. In the example of FIG. 8A., the sigma::FIFO_DEPTH 802 is declared at a size of eight. In addition, an integer sizing::FIFO_DEPTH 804 in the sizing package is set to be equal to the value of sigma::FIFO_DEPTH 802, which in this case is eight. Since the FIFO 800 is declared using a constant sizing parameter, namely sigma::FIFO_DEPTH 802, it conforms to SystemVerilog rules.

When accessing the FIFO 800 during simulation, the integer sizing::FIFO_DEPTH 804 is used. For example, the integer sizing::FIFO_DEPTH 804 is used when testing for overflow or underflow of the FIFO 800. As noted above, since sizing::FIFO_DEPTH 804 is of type integer, it can be changed during simulation. Thus, to later change the size of the FIFO 800, the value of the integer sizing::FIFO_DEPTH is changed as illustrated in FIG. 8B.

FIG. 8B is an illustration showing the FIFO 800 having the FIFO depth changed utilizing the integer sizing:: FIFO_DEPTH 804, in accordance with an embodiment of the present invention. In particular, FIG. 8B shows the FIFO 800 resized to have a FIFO depth of four. As illustrated in FIG. 8B, the value of the integer sizing::FIFO_DEPTH 804 has been changed to a value of four. Because the integer sizing:: FIFO_DEPTH 804 is utilized for all accesses to the FIFO 800 during operation, changing sizing::FIFO_DEPTH 804 to the new value of four effectively changes the depth of the FIFO 800 to four. For example, since the value of sizing:: FIFO_DEPTH 804 is utilized to determine if there is an overflow when writing to the FIFO, exceeding the value of four causes an overflow.

Once the design is tested, it is transformed into RTL. In one embodiment, the variable-names found in the sigma package are converted to "defines," based on the customer specification. In addition, in one embodiment, strings indicating the sigma package name and the sizing package name, for example all "sigma::" and "sizing::" strings, are replaced with a particular character, such as a Grave accent. Thus, for example, the parameter name sigma::FIFO_DEPTH and the integer name sizing::FIFO_DEPTH both become 'FIFO_DEPTH.

Referring back to FIG. 7, connection based configuration is established in operation 706. To provide connection based configurability embodiments of the present invention can utilize a conditional expression. For example, in one embodiment an "exist( )" macro is utilized to provide connection based configurability, as illustrated in FIG. 9.

Figure 9:
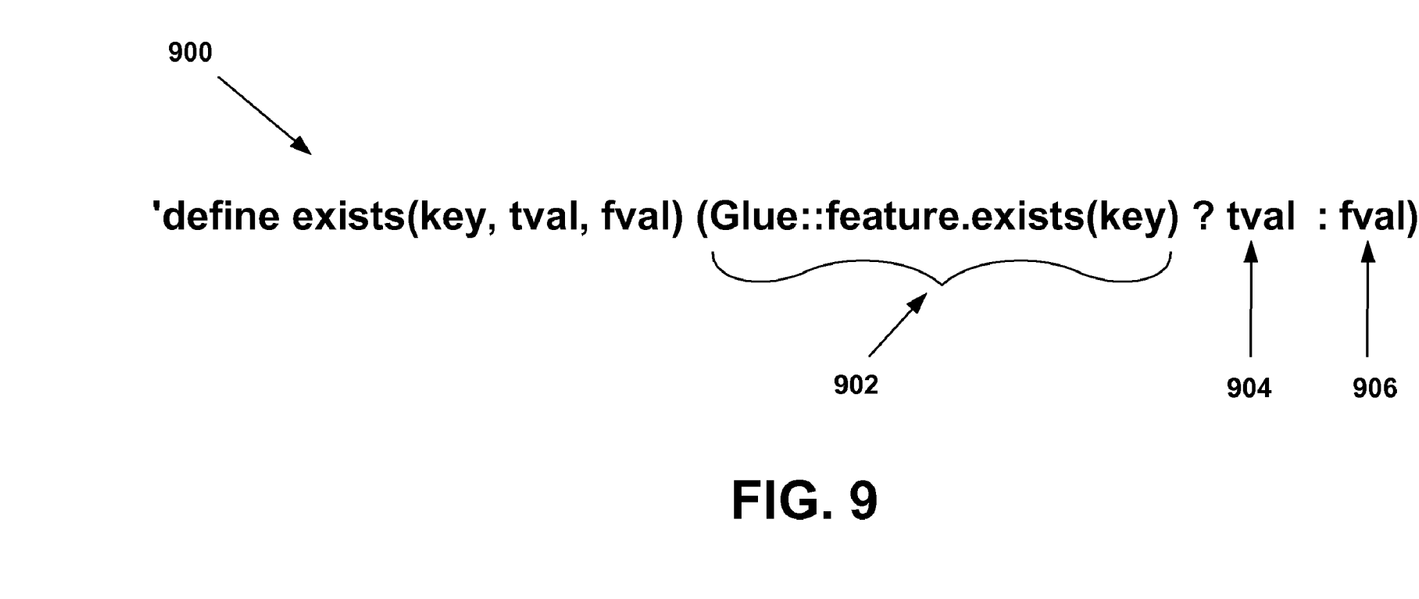
FIG. 9 shows a conditional expression in the form of an "exist( )" macro to provide connection based configurability, in accordance with an embodiment of the present invention.

FIG. 9 shows a conditional expression in the form of an "exist( )" macro 900 to provide connection based configurability, in accordance with an embodiment of the present invention. As illustrated in FIG. 9, the exists( ) macro 900 includes a conditional expression 902, a true value 904, and a false value 906. In operation, if the conditional expression 902 is true, the exists( ) macro 900 takes on the value of the true value 904, otherwise the exist( ) macro 900 takes of the value of the false value 906.

Here, the conditional expression 902 is the value of the feature array at a particular index. Thus, if the particular feature is to be included in the delivery controller, the feature array at that index will be a non-zero value, which evaluates to true and results in the exists( ) macro 900 taking on the value of the true value 904. However, if the particular feature is not to be included in the delivery controller, the feature array at that index will be zero, which evaluates to false and results in the exists( ) macro 900 taking on the value of the false value 906. Thus, the exists( ) macro 900 can be used to assign particular connections based on whether a feature is present in the design.

Turning back to FIG. 7, the Sigma controller RTL is filtered based on attribute configurability, in operation 708. Selected instances can be preceded with attributes that direct the configurability module on how to filter the resulting delivery RTL. In one embodiment, the configurability module examines the source code for particular attributes for filtering. For example, in one embodiment the attribute (* Cfg"Feature"*) is used to indicate that the attribute name itself and the following code should be removed up to the first semicolon if the indicated feature is not present. In addition, once the configurability module removes any instance in this manner, the configurability module removes any statement (i.e. assignment) where the instance name is on the Left-Hand-Side (LHS), and further removes named ports if the removed instance name is referenced in the portlist of an instantiation. However, if the feature is present, only the attribute name itself is removed.

Figure 10:
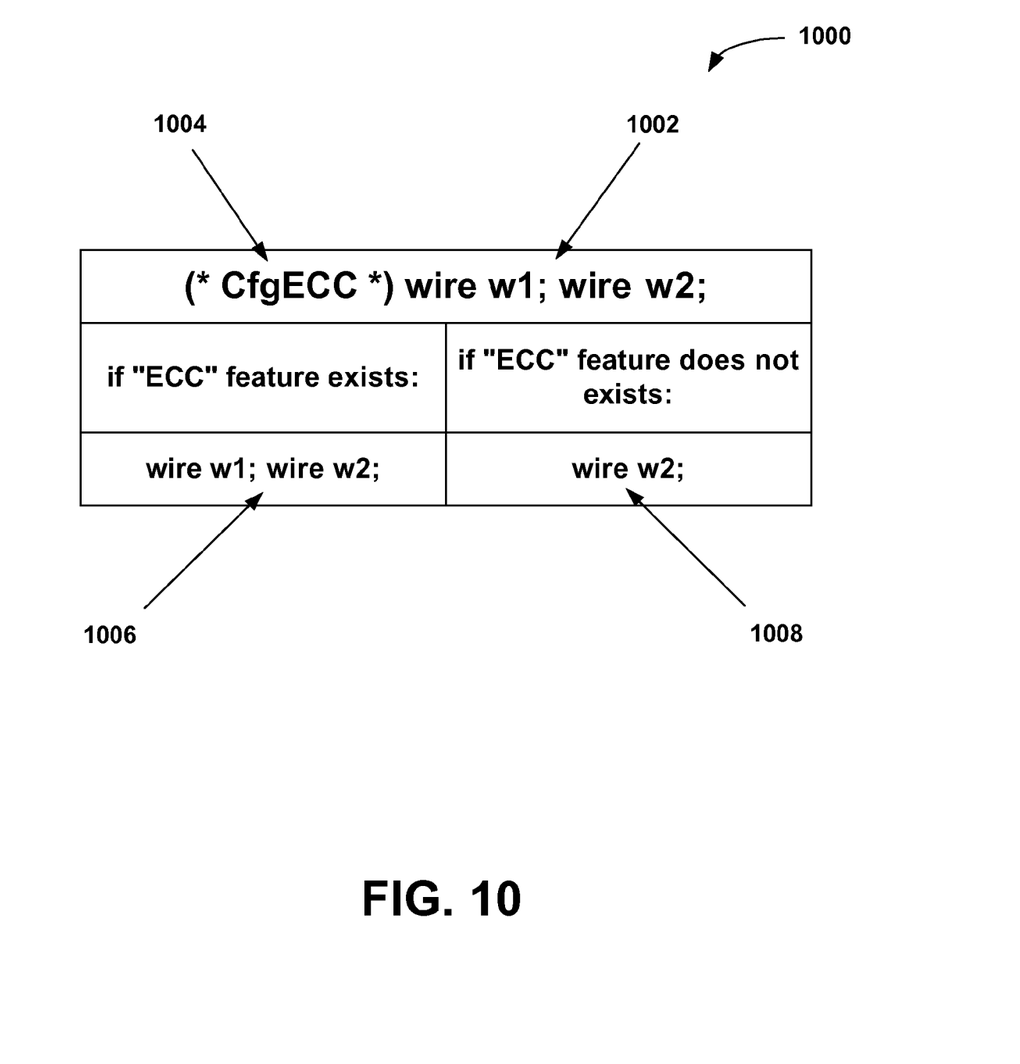
FIG. 10 is an attribute chart illustrating attribute configurability, in accordance with an embodiment of the present invention.

FIG. 10 is an attribute chart 1000 illustrating attribute configurability, in accordance with an embodiment of the present invention. The attribute chart 1000 includes an exemplary code segment 1002 preceded by an ECC attribute 1004 named (* CfgECC *). During operation 708, the configuration module examines the source code for attribute names. When an attribute name in the form of (* Cfg"Feature" *) is encountered, for example (* CfgECC *), the configuration module determines whether the named feature is included in the configuration array or feature array of the glue package. If the feature is present, only the attribute name 1004 itself is removed, as shown in code segment 1006. However, if the feature is not present the configuration module removes the attribute name itself and the following code up to the first semicolon encountered, as shown in code segment 1008.

Similarly, in one embodiment the attribute (* NotCfg"Feature" *) is used to indicate that the attribute name and the following code should be removed up to the first semicolon if the indicated feature is present. As above, once the configurability module removes any instance in this manner, the configurability module removes any statement (i.e. assignment) where the instance name is on the Left-Hand-Side (LHS), and removes named ports if the removed instance name is referenced in the portlist of an instantiation. However, if the feature is not present only the attribute name itself is removed.

Referring back to FIG. 7, post process operations are performed in operation 710. Post process operations can include testing the delivery controller, generating the delivery controller RTL, and other post process operations that will be apparent to those skilled in the art.

Turning back to FIG. 6, the resulting delivery controller code is tested in operation 608 once the Sigma controller RTL is configured based on the customer specification. Having utilized the initialized configuration array and feature array to establish the sizing configuration and the connection configuration, and having filtered the Sigma controller RTL based on attribute configurability, the resulting code is tested to ensure proper operation.

Thereafter, the delivery controller RTL is produced in operation 610. In this manner, the embodiments of the present invention configure the configurable constructs of the Sigma controller RTL based on a customer request. The resulting RTL is delivered to the customer as the delivery controller RTL. As a result, the delivery controller RTL includes only the features, configured interfaces, number and size of ports, depths of FIFOs, and other options as requested by the customer.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for building configurable designs, utilizing a computerized system, comprising the operations of:

creating an initial version of a configurable design using a hardware descriptive language, the initial version of the configurable design having a plurality of instantiated configurable constructs specifying a set of features that are optionally included in a derived version of the configurable design, the configurable constructs including a plurality of first-in first-out (FIFO) depths, wherein at least one FIFO depth is resized at simulation time without re-elaboration of the configurable design;

utilizing the computerized system to generate the derived version of the configurable design by removing configurable constructs from the initial version of the configurable design and configuring included FIFO depths based on a specification, wherein the specification indicates which configurable constructs are to be included in the derived version of the configurable design, and wherein the derived version of the configurable design is suitable for synthesis and configuring a configuration array based on the specification to indicate which configurable constructs are to be included in the derived version of the configurable design, wherein the configuration array is utilized to generate the derived version of the configurable design.

2. A method as recited in claim 1, wherein the configurable constructs include specific features that may optionally be included in the derived version of the configurable design.

3. A method as recited in claim 1, wherein the configurable constructs include sizing-based configurability constructs, wherein the sizing-based configurability constructs allow varying bus sizes and varying FIFO sizes in the derived version of the configurable design.

4. A method as recited in claim 1, wherein the configurable constructs include connection-based configurability constructs, wherein the connection-based configurability constructs provide connection configurability based on features included in the derived version of the configurable design.

5. A method as recited in claim 1, wherein the configurable constructs include attribute-based configurability constructs, wherein the attribute-based configurability constructs provide configurability based attribute strings inserted into source code of the initial version of the configurable design.

6. A method as recited in claim 1, further comprising configuring a feature array to include derivative values based on selected values in the configuration array, wherein the feature array is utilized to generate the derived version of the configurable design.

7. A system for building configurable designs comprising:

an initial version of a configurable design modeled in a hardware descriptive language, the initial version of the configurable design having a plurality of instantiated configurable constructs specifying a set of features that are optionally included in a derived version of the configurable design, the configurable constructs including a plurality of first-in first-out (FIFO) depths, wherein at least one FIFO depth is resized at simulation time without re-elaboration of the configurable design; and a configuration module that removes configurable constructs from the initial version of the configurable design and configures included FIFO depths based on a specification, wherein the specification indicates which configurable constructs are to be included in the derived version of the configurable design, wherein the derived version of the configurable design is suitable for synthesis, and wherein the configuration module utilizes a configuration array to generate the derived design, wherein the configuration array is configured based on the specification to indicate which configurable constructs are to be included in the derived version of the configurable design.

8. A system as recited in claim 7, wherein the configurable constructs include specific features that may optionally be included in the derived version of the configurable design.

9. A system as recited in claim 7, wherein the configurable constructs include sizing-based configurability constructs, wherein the sizing-based configurability constructs allow varying bus sizes and varying FIFO sizes in the derived version of the configurable design.

10. A system as recited in claim 7, wherein the configurable constructs include connection-based configurability constructs, wherein the connection-based configurability constructs provide connection configurability based on features included in the derived version of the configurable design.

11. A system as recited in claim 7, wherein the configurable constructs include attribute-based configurability constructs, wherein the attribute-based configurability constructs provide configurability based attribute strings inserted into source code of the initial version of the configurable design.

12. A system as recited in claim 7, wherein the configuration module further utilizes a feature array to generate the derived version of the configurable design, wherein the feature array includes derivative values based on selected values in the configuration array.

13. A method for building a memory controller utilizing a computerized system, comprising the operations of:

creating an initial version of a configurable controller model using a hardware descriptive language, the initial version of the configurable controller model having a plurality of instantiated configurable constructs specifying a set of features that are optionally included in a derived version of the controller model, the configurable constructs including specific features that are optionally included in the derived version of the controller model, wherein at least one specific feature is enabled or disabled at simulation time without re-elaboration of the configurable controller model, the configurable constructs include sizing-based configurability constructs, wherein sizing-based configurability constructs allow varying bus sizes and varying of first-in first-out (FIFO) sizes in the derived version of the controller model;

utilizing the computerized system to generate the derived version of the controller model by removing configurable constructs from the initial version of configurable controller model based on a customer specification, wherein the customer specification indicates which configurable constructs are to be included in the derived version of the configurable controller model, and wherein the derived version of the configurable controller model is suitable for synthesis and configuring a configuration array based on the specification to indicate which configurable constructs are to be included in the derived version of the controller model, wherein the configuration array is utilized to generate the derived version of the controller model.

14. A method as recited in claim 13, wherein the specific features that may optionally be included in the derived version of the controller model are defined in individual packages in the initial version of the configurable controller model.

15. A method as recited in claim 13, wherein the configurable constructs include connection-based configurability constructs, wherein the connection-based configurability constructs provide connection configurability based on features included in the derived version of the controller model.

16. A method as recited in claim 13, wherein the configurable constructs include attribute-based configurability constructs, wherein the attribute-based configurability constructs provide configurability based attribute strings inserted into source code of the initial version of the configurable controller model.

* * * * *